(12) United States Patent
Holland et al.

(10) Patent No.: US 10,957,685 B2
(45) Date of Patent: Mar. 23, 2021

(54) MULTI-TRENCH SEMICONDUCTOR DEVICE AND METHOD OF MANUFACTURE THEREOF

(71) Applicant: NEXPERIA B.V., Nijmegen (NL)

(72) Inventors: Steffen Holland, Hamburg (DE); Zhihao Pan, Nijmegen (NL); Jochen Wynants, Nijmegen (NL); Hans-Martin Ritter, Hamburg (DE); Tobias Sprogies, Hamburg (DE); Thomas Igel-Holtzendorff, Nijmegen (NL); Wolfgang Schnitt, Hamburg (DE); Joachim Utzig, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/164,335

(22) Filed: Oct. 18, 2018

(65) Prior Publication Data

US 2019/0123037 A1    Apr. 25, 2019

(30) Foreign Application Priority Data

Oct. 23, 2017  (EP) ..................................... 17197795

(51) Int. Cl.
*H01L 27/02*  (2006.01)
*H01L 21/3065*  (2006.01)
(Continued)

(52) U.S. Cl.
CPC ...... *H01L 27/0255* (2013.01); *H01L 21/0273* (2013.01); *H01L 21/223* (2013.01);
(Continued)

(58) Field of Classification Search
CPC ............... H01L 27/0255; H01L 21/743; H01L 27/0248; H01L 29/0684; H01L 29/417;
(Continued)

(56) References Cited

U.S. PATENT DOCUMENTS 6,451,702 B1 *  9/2002  Yang ................... H01L 27/1446
                                                      438/706
6,538,299 B1 *  3/2003  Kwark ................ H01L 31/1804
                                                      257/458

(Continued)

FOREIGN PATENT DOCUMENTS

JP          2007266622 A  * 10/2007

OTHER PUBLICATIONS

Extended European Search Report for the corresponding application EP 17 19 7795.2, dated Oct. 1, 2018, 5 pages.

*Primary Examiner* — Steven H Loke
*Assistant Examiner* — Juanita B Rhodes
(74) *Attorney, Agent, or Firm* — Ohlandt, Greeley, Ruggiero & Perle, LLP

(57) ABSTRACT

A semiconductor device and method of manufacturing a semiconductor device are provided. The semiconductor device includes a semiconductor substrate and a semiconductor layer located on the substrate; at least one shallow trench and at least one deep trench. Each of the at least one shallow trench and the at least one deep trench extending from a first major surface of the semiconductor layer. Sidewall regions and base regions of the trenches comprise a doped trench region and the trenches are at least partially filled with a conductive material contacting the doped region. The shallow trenches terminate in the semiconductor layer and the deep trench terminates in the semiconductor substrate.

12 Claims, 6 Drawing Sheets

(51) Int. Cl.
*H01L 21/223* (2006.01)
*H01L 29/36* (2006.01)
*H01L 21/027* (2006.01)
*H01L 21/74* (2006.01)
*H01L 29/06* (2006.01)
*H01L 29/417* (2006.01)
*H01L 27/08* (2006.01)
*H01L 29/861* (2006.01)
*H01L 29/66* (2006.01)

(52) U.S. Cl.
CPC ........ *H01L 21/3065* (2013.01); *H01L 21/743* (2013.01); *H01L 27/0248* (2013.01); *H01L 27/0814* (2013.01); *H01L 29/0649* (2013.01); *H01L 29/0684* (2013.01); *H01L 29/36* (2013.01); *H01L 29/417* (2013.01); *H01L 29/66136* (2013.01); *H01L 29/861* (2013.01)

(58) Field of Classification Search
CPC ............. H01L 29/0649; H01L 21/3065; H01L 27/0814; H01L 21/223; H01L 29/861; H01L 29/66136; H01L 29/36; H01L 21/0273; H01L 29/0634
See application file for complete search history.

(56) References Cited

U.S. PATENT DOCUMENTS

| | | | |
|---|---|---|---|
| 6,943,409 B1* | 9/2005 | Cheng | B82Y 20/00 257/330 |
| 2003/0122210 A1* | 7/2003 | Cohen | H01L 31/105 257/465 |
| 2005/0145945 A1 | 7/2005 | Zdebel et al. | |
| 2008/0142883 A1 | 6/2008 | Grebs et al. | |
| 2010/0044791 A1* | 2/2010 | Hebert | H01L 29/66734 257/341 |
| 2010/0044792 A1* | 2/2010 | Hebert | H01L 29/66734 257/341 |
| 2012/0007169 A1 | 1/2012 | Hikida et al. | |
| 2012/0139080 A1 | 6/2012 | Wang et al. | |
| 2013/0153916 A1* | 6/2013 | Weyers | H01L 27/06 257/73 |
| 2014/0073123 A1 | 3/2014 | Meiser et al. | |
| 2014/0124855 A1* | 5/2014 | Hebert | H01L 29/0634 257/334 |
| 2015/0035051 A1* | 2/2015 | Hebert | H01L 29/0878 257/334 |
| 2015/0179734 A1* | 6/2015 | Guowei | H01L 21/32055 257/506 |
| 2015/0372131 A1* | 12/2015 | Hebert | H01L 29/0623 257/330 |
| 2018/0247996 A1* | 8/2018 | Wang | H01L 21/761 |

* cited by examiner

MULTI-TRENCH SEMICONDUCTOR DEVICE AND METHOD OF MANUFACTURE THEREOF

CROSS REFERENCE TO RELATED APPLICATION

The present application claims foreign priority to European Patent Application No. 17197795.2 filed on Oct. 23, 2017 the entirety of which is incorporated by reference hereby.

FIELD

The present disclosure relates to a semiconductor device and to a method of manufacturing a semiconductor device. In particular, the present disclosure relates to a semiconductor electrical surge protection device and associated method of manufacture.

BACKGROUND

Electrical surges such as electrical overstress or transient pulses are common causes of damage to electronic devices. To protect against such transient surges, electronic devices are conventionally protected by surge protection devices. Such devices provide protection against electrical overstress and are commonly used in portable/consumer electronic devices such as personal computers, audio and video equipment or mobile telephones.

In surge protection applications, discrete diodes are often used for dissipating unwanted energy and during a surge event they may be required to withstand high electrical currents and/or high electrical energies. Such discrete diodes are typically formed of a bipolar junction arranged in a bulk semiconductor material. Such devices may also include: a frame for mounting the bulk semiconductor material; bond wires or lead clips for contacting to contacts on the bulk semiconductor material.

Typically, diodes are realized with a so-called shallow diffusion area on the top of bulk semiconductor material, the doping of the bulk being opposite to that of the diffusion and the diffusion area contacted a metal. The other contact is usually a contact to the bulk. The bulk contact may either be on the same side of the crystal as shallow diffusion area or opposing the top of the bulk semiconductor material on the back of the crystal.

The maximum power dissipation capability of such a discrete diode is limited by the maximum current density at the junction of the discrete diode and the maximum power dissipation in the device is dependent on the serial resistances of the diode. Serial resistances of devices, are made up for example of lead frame resistances, bond wire or clip bond resistances, contact resistances and bulk semiconductor material resistance. In other words, the maximum current surge a device can drain to ground will be dependent on the area of the junction. That is, the ability to drain current to ground increases with the area of the semiconductor junction.

With diffusion and bulk contact on the same side of the crystal one frequently observes current crowding at the contact sides nearest to each other. Current crowding can lead to localised heating in the vicinity of the contacts which can result in thermal hot spots and thermal runaway, leading to catastrophic device failure.

Problematically, the maximum area of the semiconductor junction is limited by the size of the piece of semiconductor crystal. If a bigger area is needed then the semiconductor crystal size may be increased accordingly. However, the size of the semiconductor crystal may be limited due to package size, particularly for so-called chip scale packages, and/or cost constraints.

The bulk resistance is linearly dependent on the thickness of the semiconductor crystal (when a backside contact is used). Mechanical reasons such as eventual wafer strength limit the thinning of the crystal, so that typically the perpendicular distance between the thickness of the crystal is approximately 200 µm. To reduce the thickness of the semiconductor crystal and therefore the bulk resistance and thereby the serial resistance of the diode, doped substrates may be used. However, with doped substrates a low-doped epitaxial layer has to be deposited on top of the substrate before the diode diffusion is formed. This adds to the cost of the fabrication process.

SUMMARY

According to an embodiment, a semiconductor device comprises: a semiconductor substrate and a semiconductor layer located on the substrate; at least one shallow trench and at least one deep trench, each of the at least one shallow trench and the at least one deep trench extending from a first major surface of the semiconductor layer, wherein sidewall regions and base regions of the trenches comprise a doped trench region and the trenches are at least partially filled with a conductive material contacting the doped region; wherein the shallow trenches terminate in the semiconductor layer and the deep trench terminates in the semiconductor substrate.

A semiconductor junction area is formed by the doped trench region and the semiconductor layer. The semiconductor junction area may be substantially larger than a planar type device with same semiconductor crystal size and first major surface (or top side area). As a result, more current per surface area may flow because surface area and semiconductor junction area are independent due to the arrangement of trenches forming vertical junctions.

The semiconductor device may comprise an alternating structure of shallow and deep trenches. This arrangement of deep and shallow trenches allows for an ohmic contact to the deep trench via semiconductor substrate and the formation of back to back pn-junctions having increased surface area between the semiconductor layer and the diffusion layers.

The semiconductor device may also comprise a first electrical contact formed to electrically connecting to the conductive material of the at least one shallow trench on the first major surface of the semiconductor layer. This defines the so-called top-side contact of the device on the first major surface.

The semiconductor device may be arranged such that the second electrical contacted arranged on a second major surface of the semiconductor substrate opposing the first major surface. This defines the so-called bottom contact of the device on the second major surface. The semiconductor device may be arranged wherein the substrate is a first conductivity type, the semiconductor layer is a second conductivity type, and the doped trench region is a first conductivity type. This defines the back to back diode arrangement having increase surface area. Optionally, an additional isolating layer is placed between the substrate and the semiconductor layer.

According to an embodiment, a method of manufacturing a semiconductor device may comprise: forming a semiconductor layer on a semiconductor substrate; forming at least one shallow trench and at least one deep trench, each of the at least one shallow trench and at least one deep trench trenches extending from a first major surface of the semiconductor layer, wherein the shallow trench terminates in the semiconductor layer and the deep trench terminates in the semiconductor substrate, forming doped trench regions at sidewall regions and base regions of the trenches; and forming a conductive material in each of the trenches to contact the doped trench regions.

The method may comprise forming an alternating structure of shallow and deep trenches. The alternating arrangement of deep and shallow trenches provides increased doped trench regions and semiconductor layer, thereby increasing the current handling capabilities of the device.

The method may also comprise forming a first electrical contact for electrically connecting to the conductive material of the at least one shallow trench on the first major surface of the semiconductor layer. This defines the so-called topside contact of the device on the first major surface.

The method may also comprise forming a second electrical contact arranged on a second major surface of the semiconductor substrate opposing the first major surface. This defines the so-called bottom contact of the device on the second major surface.

According to embodiments, forming the at least one shallow trench and the at least one deep trench may comprise: forming an oxide on first major surface of the semiconductor layer above regions, forming windows in the oxide above the regions where the shallow and deep trenches will be formed; forming a resist layer in the windows; etching the deep trenches to a first depth; removing the resist and etching the shallow trenches to a first depth and simultaneously etching the deep trenches and shallow trenches simultaneously to respective final depths.

Alternatively, forming the at least one shallow trench and the at least one deep trench may comprise: etching the at least one deep trench to a first depth; etching the oxide above the shallow trenches; and etching the shallow trench, at the same time etching the deep trench to a second depth. Alternatively, forming the at least one shallow trench and the at least one deep trench may comprise: etching the at least one deep trench to a first depth, at the same time etching the oxide (above the shallow trenches) etching the shallow trench, at the same time etching the deep trench to a second depth.

The method may comprise forming doped trench regions at sidewall regions and base regions of the at least one shallow trench and the at least one deep trenches comprises exposing the sidewalls and base of the trenches to a doping diffusion.

DESCRIPTION OF THE DRAWINGS

The invention is described further hereinafter by way of example only with reference to the accompanying drawings in which:

In the figures and the following description and unless otherwise stated like reference numerals refer to like features.

FIGS. 1A to 1D illustrate the principle process steps in an example method of manufacturing a semiconductor device 100 in accordance with embodiments of the present disclosure. As illustrated in FIG. 1A a semiconductor wafer 102 is provided. The semiconductor wafer 102 may comprise a semiconductor substrate 104 and a semiconductor layer 106 may be formed on the semiconductor substrate 104. The semiconductor layer 106 may be formed on the semiconductor substrate 104 by any appropriate process. For example, the semiconductor layer 106 may be formed by epitaxial techniques, diffusion, bonding or implantation. The semiconductor substrate 104 may be a silicon substrate.

The semiconductor substrate 104 may be more highly doped than the semiconductor layer 106 and in this regard the semiconductor substrate 104 may be doped in the region 1e18 cm$^{-3}$ to 1e20 cm$^{-3}$ and the semiconductor layer 106 may be doped in the region 1e14 cm$^{-3}$ to 1e17 cm$^{-3}$. The semiconductor substrate 104 may be degenerately doped when compared to the semiconductor layer 106. In this way, the semiconductor substrate 104 may be considered to have low electrical resistance or in other words the semiconductor substrate 104 may be considered to be low ohmic.

The conductivity type of the semiconductor substrate 104 may be opposite to the conductivity type of the semiconductor layer 106. For example, the semiconductor layer 106 may p-type and the semiconductor substrate 104 may be n-type.

Figure 1A:
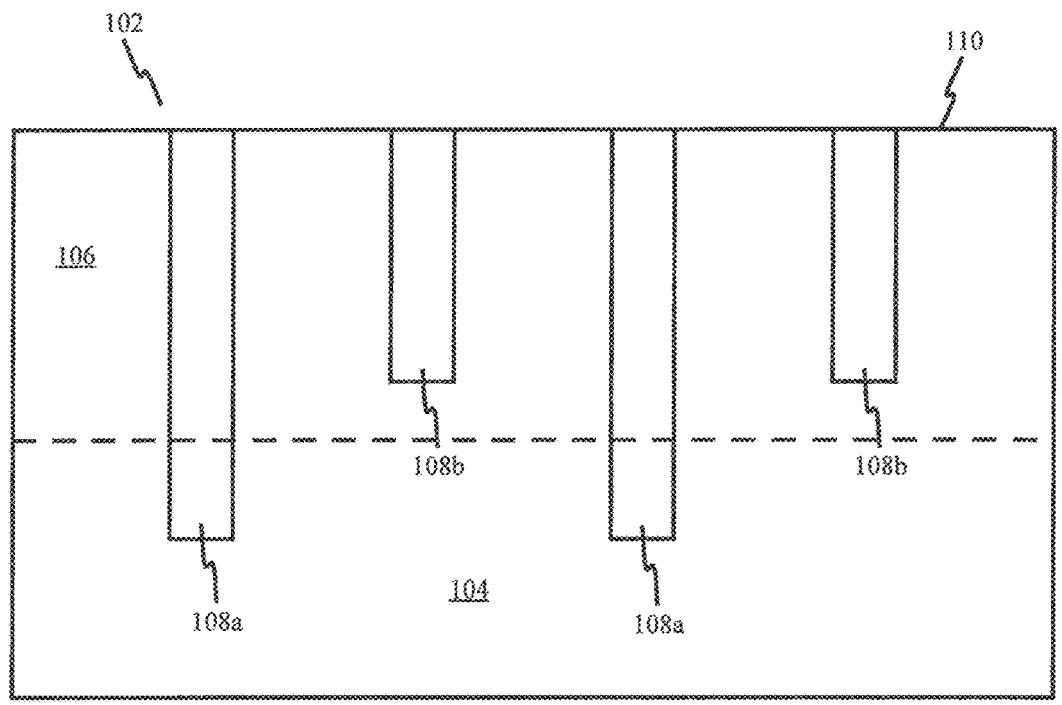
FIGS. 1A to 1D show steps in a method of manufacturing a semiconductor device in accordance with embodiments of the present disclosure.

As illustrated in FIG. 1A, an alternating system of trenches 108a, 108b are formed in the wafer 102. The trenches 108a, 108b may be formed by lithographic techniques, laser etching or any appropriate semiconductor etching technique. The trenches 108a, 108b may extend from a first major surface 110 of the wafer 102 into the wafer 102.

In FIG. 1A, an arrangement of deep trench 108a followed by shallow trench 108b may be repeated dependent on the level of surge protection required to form the alternating arrangement of trenches. The skilled person will appreciate that the arrangement of trenches may be such that there is one deep trench and one shallow trench. However, the skilled person will also appreciate that the greater number of shallow and deep trenches the larger the semiconductor junction area which in turn results in greater current carrying capabilities. The arrangement of trenches may begin with a deep or shallow trench and end with a deep or shallow trench. In other words, there is only a need for at least one deep and one shallow trench and the number of deep trenches need not equal the number of shallow trenches.

The deep trenches 108a may be formed in the wafer 102 to extend into and through the semiconductor layer 106 and terminate in the semiconductor substrate 104. In other words, the depth of the deep trenches 108a should be deeper than the thickness of the semiconductor layer 106. The shallow trenches 108b may be formed in the wafer to extend into and terminate in the semiconductor layer 106. In other words, the depth of the shallow trenches should be shallower than the thickness of the semiconductor layer 106 such that the shallow trenches are not in physical contact with the semiconductor substrate 104. The distance between the bottom of the shallow trench 108b and the semiconductor substrate 104 may optionally be greater than the distance between the shallow trench 108b and the deep trench 108a.

As mentioned, the trenches 108a, 108b may be formed by any appropriate etch process. By way of example (and not illustrated), to form trenches 108a, 108b of different depths in a single etch process, a protective oxide may be formed on the first major surface 110 of the wafer 102. The protective oxide may be formed thicker above the regions where the shallow trenches 108b are formed and the protective oxide may be formed thinner above the regions where the deep trenches 108b are formed.

Figure 5:
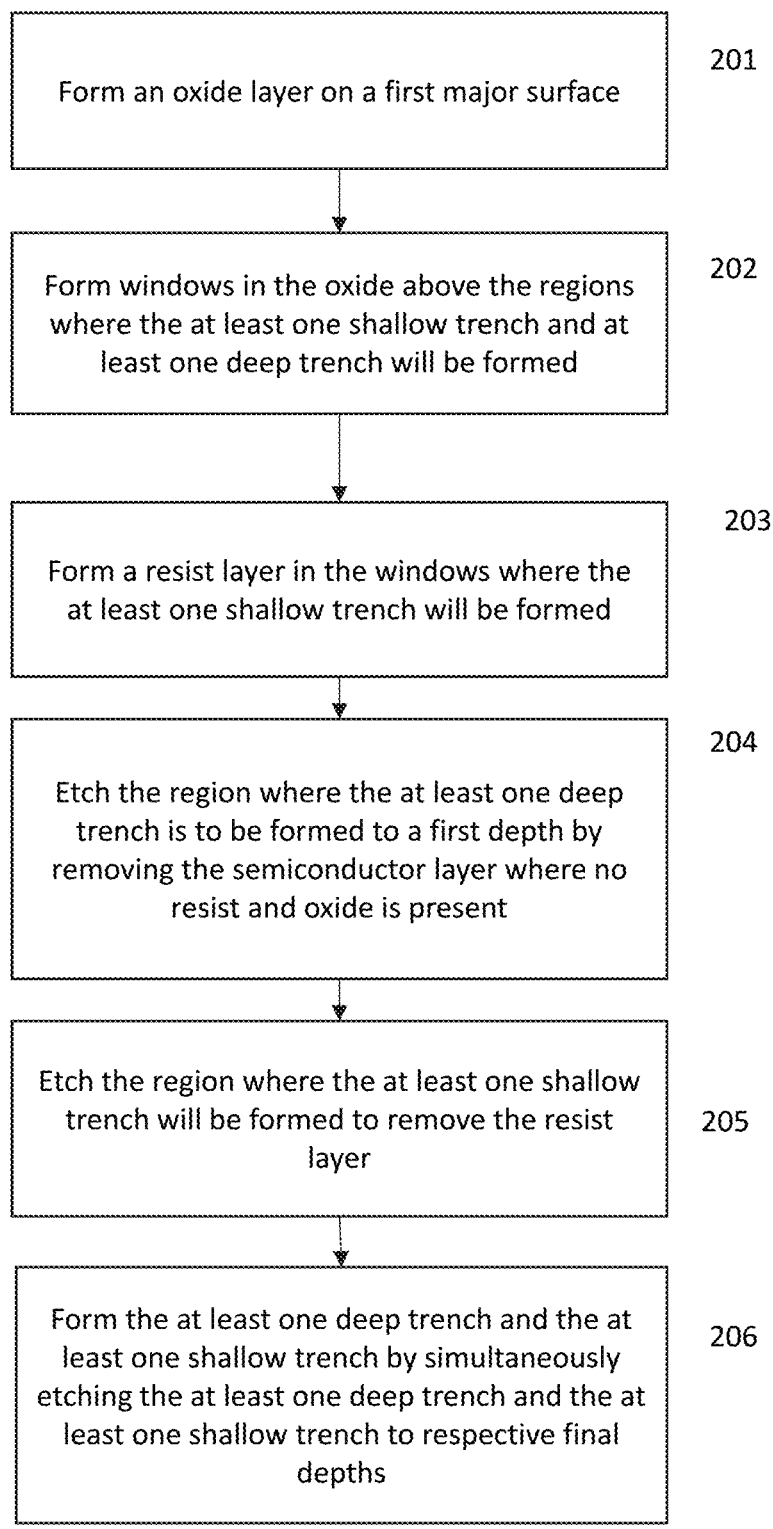
FIG. 5 shows a process for forming a semiconductor device in accordance with an embodiment of the present disclosure.

As shown in FIG. 5, at block 201 the protective oxide may, alternatively, only be formed in the regions where no trenches will be formed, thus as shown at block 202 defining processing openings or windows for subsequent processing of both the deep and shallow trenches 108a, 108b. At block 203, a resist layer may then be applied in the windows where the shallow trenches 108b will be formed. The area above the location where the shallow trenches are to be formed will be covered by the resist.

At block 204, partial formation of the deep trenches 108a may begin by removing the silicon at areas where no resist or oxide is present, using for example dry etching processes such as a deep reactive ion etch. At block 205, during partial etching of the deep trench the resist is also removed. As a result, at block 206 the windows in the oxide openings of the shallow trenches will be accessible allowing the etch process to form the final trench shallow trench depth. In this way both the deep and shallow trenches may be etched simultaneously.

Figure 1B:
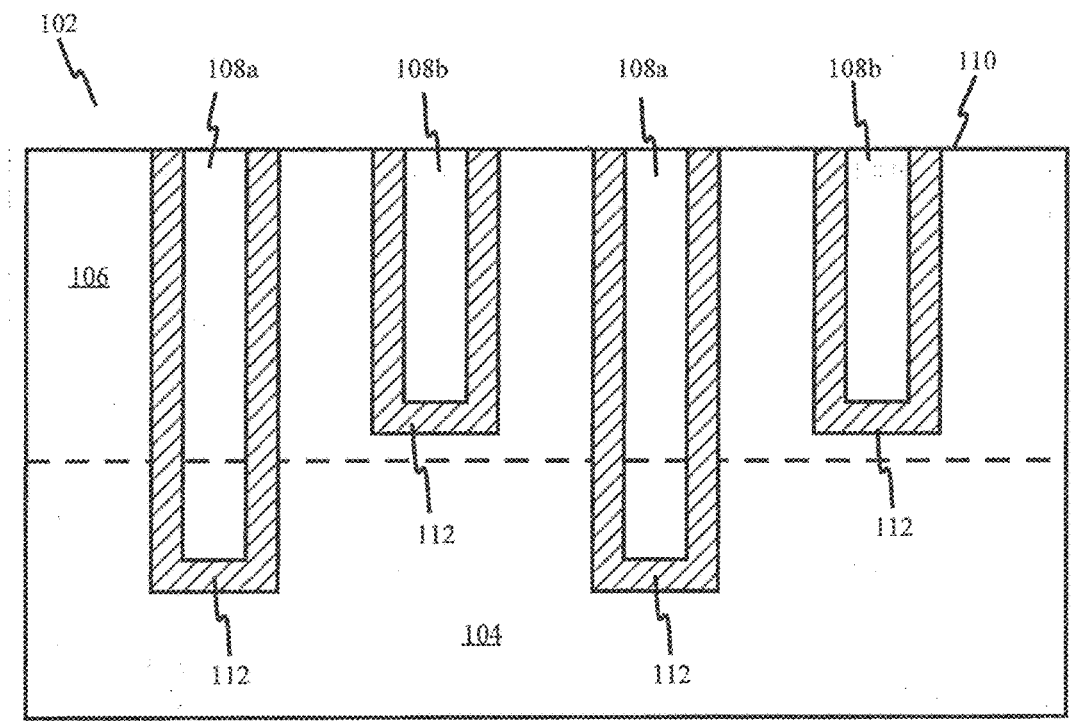

Turning now to FIG. 1B, the side walls and the bottoms (also known as the base) of the trenches 108a, 108b are exposed to a doping atmosphere by heating and then exposing the side walls and the bottoms of the trenches 108a, 108b with a gas containing doping atoms. The doping atoms then diffuse into the silicon such that the side wall regions and base regions of the trenches 108a, 108b are doped to form respective diffusion layers 112 around each of the trenches. In this way diffusion layers 112 may be seen to encase each the trenches 108a, 108b. The diffusion layers 112 may be the same conductivity type as the semiconductor substrate 104. The diffusion layers 112 may be doped to the same or similar level as the semiconductor substrate 104, that is, in the region 1e18 cm$^{-3}$ to 1e20 cm$^{-3}$ for example.

Figure 1C:
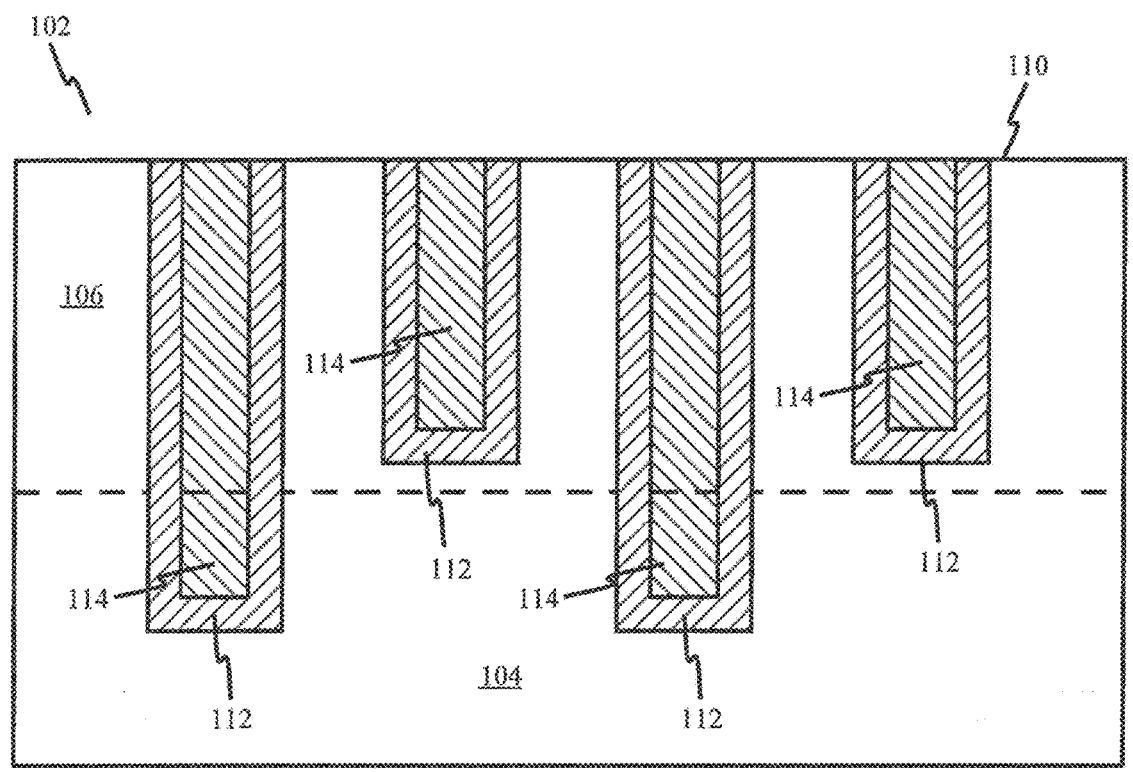

Following formation of the diffusion layers 112, each of the trenches 108a, 108b are filled with an electrically conductive material 114 as illustrated in FIG. 1C. The electrically conductive material 114 of each trench may form an ohmic contact with the diffusion layers 112 of the respective trench. The electrically conductive material may be doped poly-silicon or a suitable metal stack, formed of for example one or more of Cu, Ti or W.

Figure 1D:
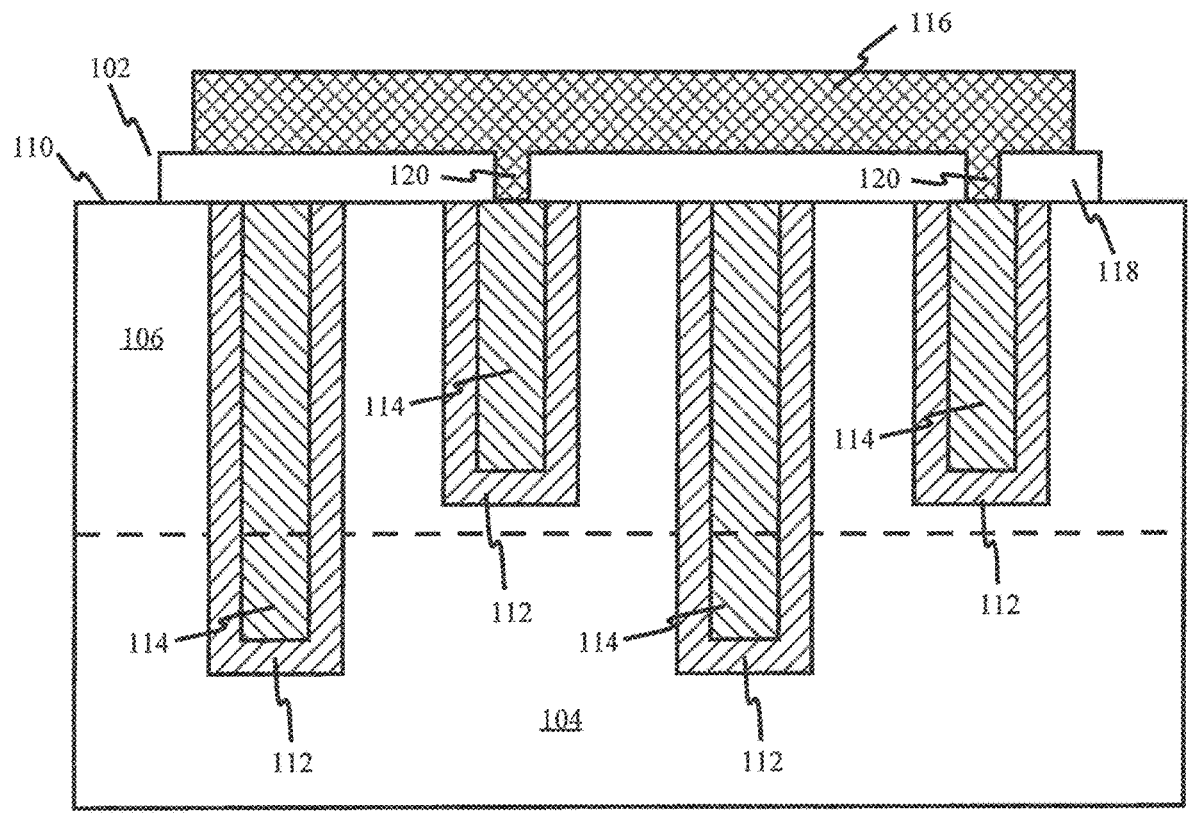

The next step of the method of manufacture is illustrated in FIG. 1D. The electrically conductive material 114 formed in each of the shallow trenches 108b is electrically connected to a common contact 116 formed on the first major surface 110 of the wafer 102. Conversely, the conductive material 114 formed in the deep trenches 108a is electrically isolated from the conductive material 114 of each of the shallow trenches and the common contact 116. The common contact 116 may be electrically isolated from the conductive material 114 formed in the deep trenches 108a by an appropriate isolating layer 118 such as oxide, nitride, oxynitride or an organic layer such as a Polyimide or a Polybenzoxazole. The isolating layer may be formed on the first major surface 110 of the wafer 102 prior to formation of the common contact 116. As required, through metal vias 120 or other suitable electrical connections may be made from the common contact 116 through the isolating layer 118 to the conductive material 114 formed in each of the shallow trenches 108b. Alternatively, the skilled person will understand that the deep trenches may be electrically connected to a common contact and the shallow trenches isolated in the same way as described above.

Figure 2A:
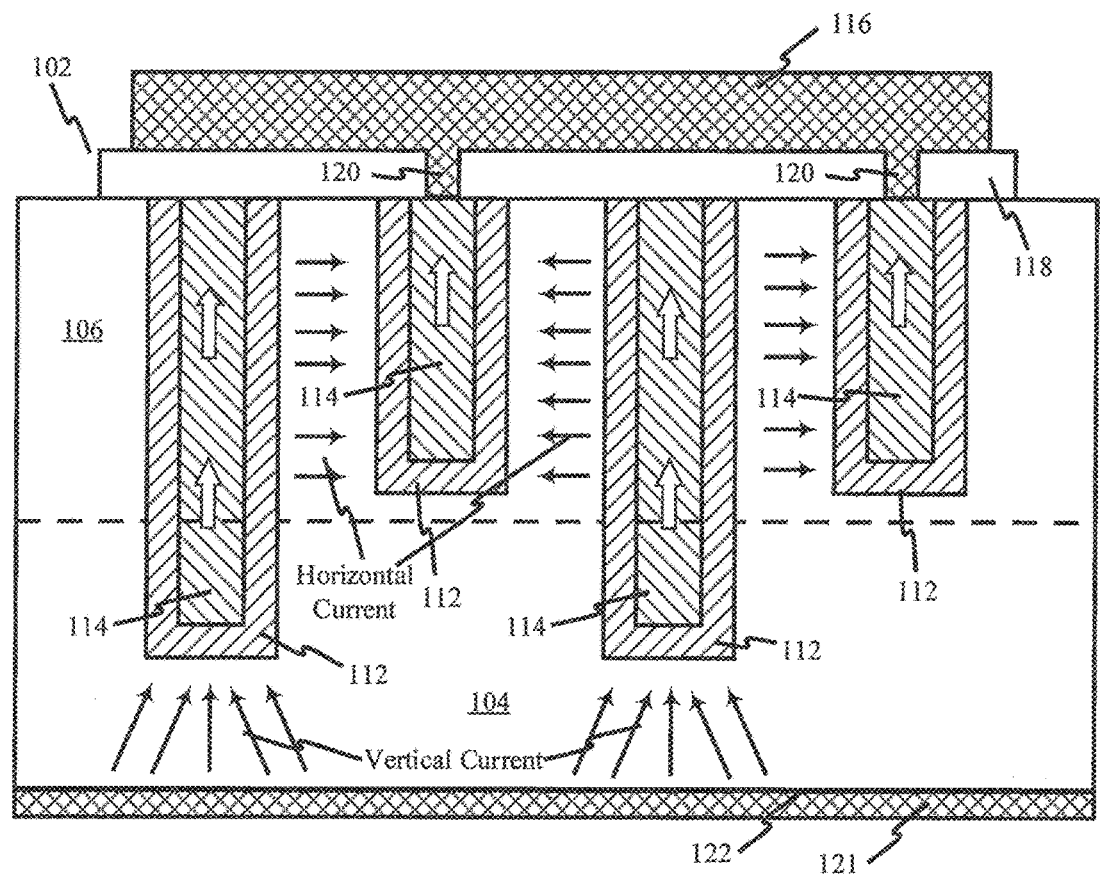
FIG. 2A shows a semiconductor device and associated current paths during operation in accordance with embodiments of the present disclosure.

Processing steps such as wafer thinning or grinding may optionally follow to define the thickness of the wafer 102. The thickness of the wafer influences the on-resistance of the diode due to the dependence of device resistance on bulk semiconductor material thickness and conductivity. Following thinning or grinding, a back metal contact 121 may be formed on the substrate as illustrated in FIG. 2A. The back metal contact 121 is formed on second major surface 122 of the wafer 102 where the second major surface 122 of the wafer opposes the first major surface 110.

The back metal contact 121 is arranged to form an ohmic contact to the semiconductor substrate 104. The semiconductor substrate 104 is in electrical contact with the conductive material 114 of the deep trenches 108a via the diffusion layers 112 formed around the deep trenches 108b. The diffusion layers 112 of the shallow trenches 108b are in electrical contact with the conductive material 114 of the shallow trenches 108b which is in turn in contact with the common contact 116. In this way, the back metal contact 120 and the common contact form external contacts of the semiconductor device 100 in accordance with embodiments.

Following formation of the back metal contact 121 the wafer may optionally be moulded in a package material. The final processing step may be singulation or dicing of the wafer into individual semiconductor devices thus arriving at the semiconductor device 102 in accordance with embodiments of the present disclosure.

Figure 2B:
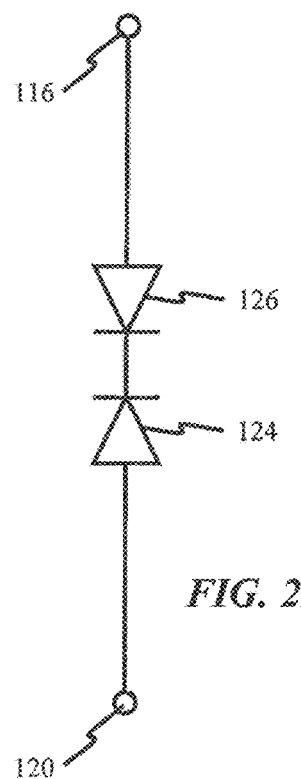
FIG. 2B shows back-to-back diodes characterising the semiconductor device in accordance with embodiments of the present disclosure.
Figure 2C:
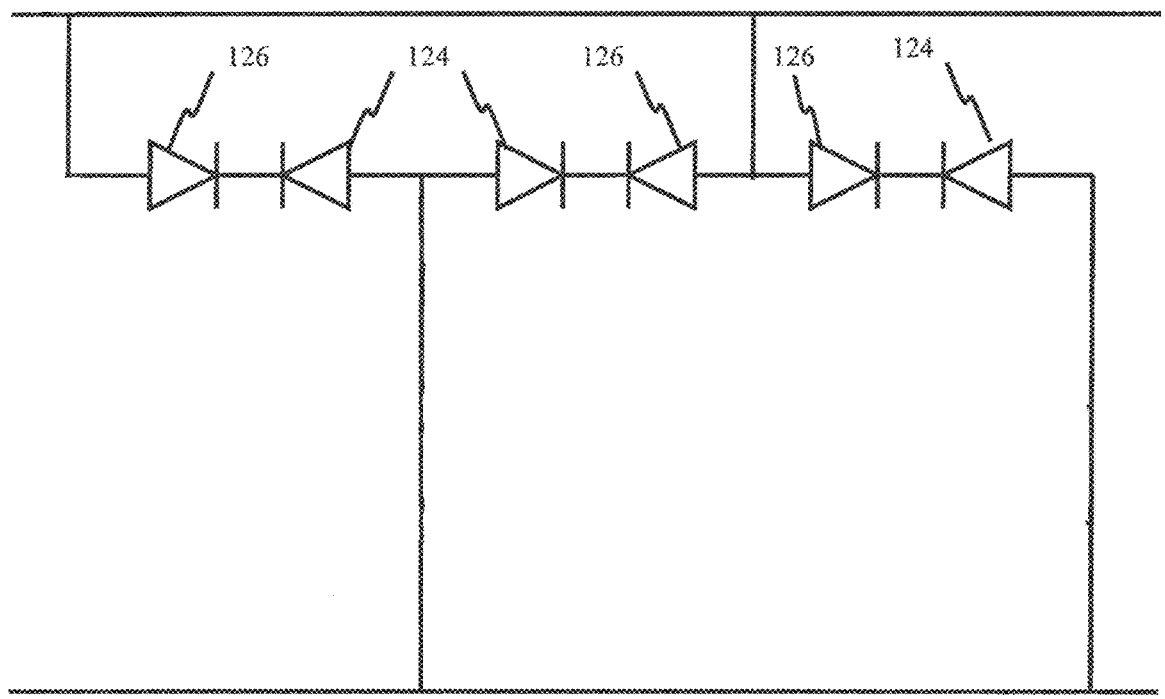
FIG. 2C shows a parallel network of diodes characterising the semiconductor device in accordance with embodiments of the present disclosure.

Referring now to FIGS. 2A to 2C, the current paths during operation, in this case breakdown mode of operation, of the semiconductor device will now be described. In overview the current path through the device may be characterised as: 1) vertical from the back metal contact 121 to the deep trenches 108a; 2) horizontal from the deep trenches to 108a to the adjacent shallow trenches 108b through the semiconductor layer 106; and 3) vertical from the shallow trenches 108b to the common contact 116.

In more detail, the first vertical current flow from the back metal contact 121 to the deep trenches 108a may be characterised as flowing from the back metal contact 121 through the substrate and diffusion layer 112 of the deep trench 108a into the electrically conductive material 114 of the deep trench. The horizontal current flow may be characterised as: 1) flowing from the electrically conductive material 114 of the deep trench through the pn junction formed by the diffusion layer 112 of the deep trench 108a and the semiconductor layer 106; 2) through the semiconductor layer 106; and 3) through the pn junction formed by semiconductor layer 106 and the diffusion layer 112 of the shallow trench 108b. The second vertical current flow from the shallow trenches 108b to the common contact 116 may be characterised as flowing from the electrically conductive material 114 of the shallow trench 108b to the common contact 116.

In this way the semiconductor device according to embodiments may be broadly characterised as an arrangement of back-to-back diodes as illustrated in FIG. 2B. A first diode 124 in the back to back arrangement is formed by the pn junction formed by the diffusion layer 112 of the deep trench 108a and the semiconductor layer 106. A second diode in the back to back arrangement is formed by the pn junction of the semiconductor layer 106 and the diffusion layer 112 of the shallow trench 108b. The terminals of the back-to-back diode arrangement are formed by the common contact 116 and the back metal contact 120.

In the context of the present application breakdown mode referred to above is the operation of the device where, provided that the voltage across the device is smaller than the breakdown voltage only a small leakage current will flow. Therefore, in order to drive current through the device, the voltage drop across the device has to be larger than the breakdown voltage. During a typical operation of the device such as draining unwanted stress current to ground the device will operate in breakdown mode. One of the two pn-junctions (either deep trench to substrate layer or shallow trench to substrate layer is in breakdown mode (avalanche mode). The other pn-junction is in forward bias mode.

Figure 3:
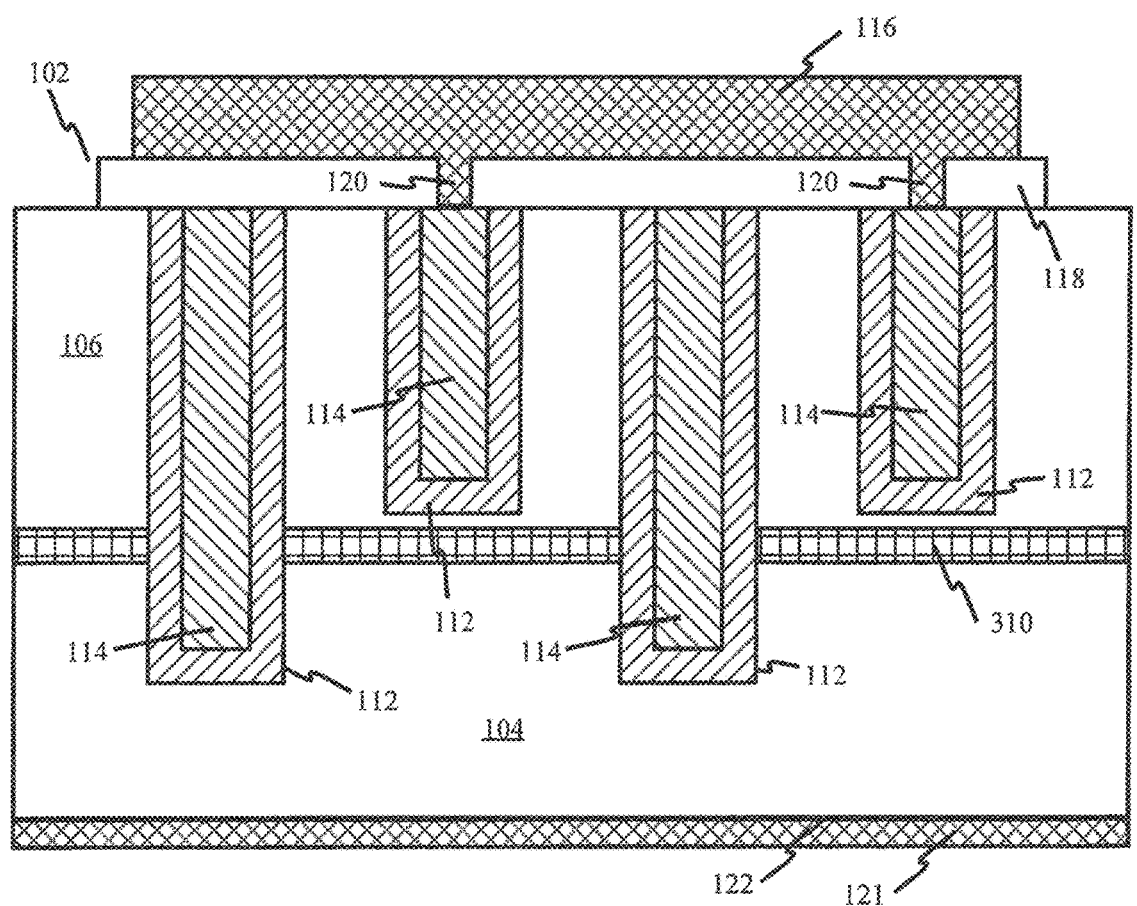
FIG. 3 shows a semiconductor device in accordance with an embodiment of the present disclosure.

In embodiments, where the semiconductor device comprises multiple alternating deep and shallow trenches as illustrated in FIG. 2A, the semiconductor device according to embodiments may be characterised as a network of back-to-back (that is, cathode to cathode, or anode to anode) first and second diodes 124, 126 as illustrated in FIG. 2C. In the arrangements of FIGS. 2A and 3, pn junctions are formed by each of the diffusion layer 112 of the deep trench 108a and the semiconductor layer 106 and pn junctions are formed by the semiconductor layer 106 and each of the diffusion layer 112 of the shallow trench 108b. In this way the arrangements of FIGS. 2A and 3 can be seen to contain multiple back to back pn junctions, that is, one back to back diode arrangement for each pair of deep and shallow trenches formed in the semiconductor layer 106 such that it is possible to form a network of multiple back to back diodes.

Optionally, the resistance for each current path (every horizontal arrow for horizontal current plus the according current paths in the deep and shallow trenches) is identical. This can be achieved by having similar resistance-per-length for the shallow and deep trenches, and a similar thickness of the conducting material within each trench. If the resistance for each path is identical, than the current distribution between the different paths will be equal. This results in a constant current density of the horizontal current along the trenches therefore and not dependent on the depth of the current within the device. In this way, current crowding can be minimised and the current carrying capability of the total device will be maximised. Current crowding has the effect that locally the critical current density will be reached, whilst the other regions have not yet reached their maximum current capability. If all of regions of the pn-junctions reach the critical current density at the same time for the same applied external voltage current crowding can approach zero.

In embodiments, an isolating layer 310 may be arranged between the semiconductor substrate 104 and the semiconductor layer 106 as illustrated in FIG. 3. The isolating layer 310 may be an oxide such as $SiO_2$. One embodiment is to start the processing with a SOI wafer (Silicon on insulator). SOI wafers are commercially available with different doping levels for the two silicon layers and with different thicknesses of the silicon layers and the sandwiched oxide layer. For example, bonded silicon on SOI wafers may be used to form the sandwiched oxide layers. The isolating layer 310 serves isolates the semiconductor substrate 104 from the semiconductor layer 106 and eliminates any parasitic diodes and/or transistors formed by the semiconductor substrate 104, the semiconductor layer 106 and the diffusion layer 112 of the deep trenches 108a and shallow trenches 108b. By eliminating any parasitic diodes and/or transistors the distance from the bottom of the shallow trenches 108b to the semiconductor substrate 104 can be reduced without increasing parasitic diodes and/or transistors. Furthermore, because the depth of the shallow trenches is increased the junction area of the pn junction formed by semiconductor layer 106 and the diffusion layer 112 of the shallow trench 108b increases. The larger the area of the junction the larger the current carrying capability of the device.

Figure 4:
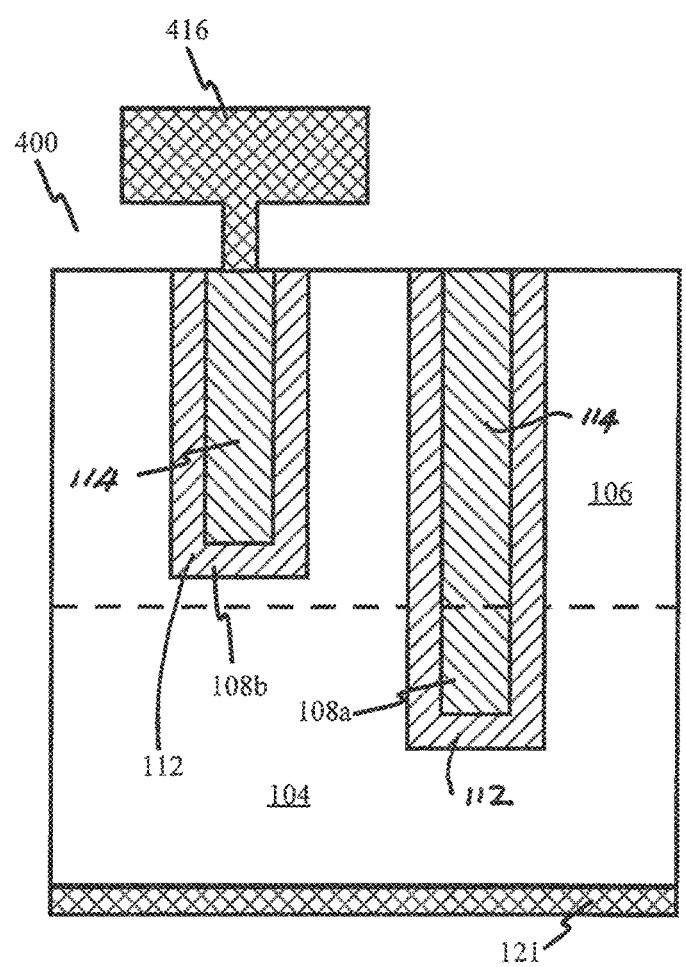
FIG. 4 shows a semiconductor device in accordance with an embodiment of the present disclosure.

With reference to FIG. 4, the semiconductor device 400 may be arranged as a single diode instead as a back-to-back diode (or a so-called open base transistor). As with the arrangements of FIGS. 2A and 3, the semiconductor device 400 may be formed on a semiconductor wafer 102 and the semiconductor wafer may comprise a semiconductor substrate 104 and a semiconductor layer 106 may be formed on the semiconductor substrate 104. The semiconductor layer 106 may be formed on the semiconductor substrate 104 by any appropriate process as discussed above with reference to FIGS. 1A to 1D. The semiconductor substrate 104 may be more highly doped than the semiconductor layer 106 and in this regard the semiconductor substrate 104 may be doped in the region 1e18 $cm^{-3}$ to 1e20 $cm^{-3}$ and the semiconductor layer 106 may be doped in the region 1e14 $cm^{-3}$ to 1e17 $cm^{-3}$. The semiconductor substrate 104 may be degenerately doped when compared to the semiconductor layer 106. In this way, the semiconductor substrate 104 may be considered have low electrical resistance or in other words the semiconductor substrate 104 may be considered to be low ohmic.

The conductivity type of the semiconductor substrate 104 may be the same as the conductivity type of the semiconductor layer 106. For example, the semiconductor layer 106 may n-type and the semiconductor substrate 104 may be n-type. Alternatively, as illustrated in FIG. 4, the conductivity type of the semiconductor substrate 104 may be opposite to the conductivity type of the semiconductor layer 106. For example, the semiconductor layer 106 may p-type and the semiconductor substrate 104 may be n-type.

The method of manufacturing the semiconductor device 400 is broadly the same as that illustrated in and described above with reference to FIGS. 1a to 1F. However, with reference to FIG. 4, the diffusion layer 112 encasing the deep and shallow trenches may be of opposite conductivity types. That is the shallow trench 108b may include a p type diffusion layer 112 and the deep trench 108a may comprise an n type conductivity type as the diffusion layer 112. The conductivity type of the semiconductor substrate 104 may be of the same type as the diffusion layer 112 encasing the deep trench 108a and in the present example of FIG. 4, the conductivity type of the semiconductor substrate 104 may be n type. The conductivity type of the semiconductor layer 106 may be opposite to the conductivity type of the semiconductor substrate 104. In the example of FIG. 4, the conductivity type of the semiconductor layer 106 may be p type and the conductivity type of the semiconductor substrate may be n type.

In the arrangement of FIG. 4, the electrically conductive material 114 formed in the shallow trench 108b is electrically connected to a contact 416 formed on the first major surface 110 of the wafer 102. A back metal contact 120 is formed on second major surface 122 of the wafer 102. The second major surface 122 of the wafer opposes the first major surface 110. The contact 416 may be electrically isolated from the conductive material 114 formed in the deep trench 108a by an appropriate isolating layer 118. The isolating layer 118 may be formed on the first major surface 110 of the wafer 102 prior to formation of the contact 416. Through metal vias 120 or other suitable electrical connections may be made from contact 416 through the isolating layer 118 to the conductive material 114 formed in the shallow trench 108b. As with the arrangement of FIG. 3, an isolating layer which serves to isolate the semiconductor substrate 104 from the semiconductor layer 106 may be included.

In the foregoing, the arrangement of the trenches can be adapted to the required functionality of the semiconductor device. Specifically, the geometry of the trenches can be any appropriate shape such as cylindrical or rectilinear in cross-section, so as to vary the area of the semiconductor junction and thereby vary the current capacity of the device The arrangement of n type and p type regions as described above may be juxtaposed according to the particular circumstances, and as required by the application of the semiconductor device.

One or more of the arrangements described above may be modified to form a bipolar transistor. A bipolar transistor may be formed by the addition of a further contact to the semiconductor layer 106. The further contact may be formed on the first major surface 110 of the semiconductor wafer 102. The deep trenches may form the emitter and the shallow trenches may form the base of the bipolar transistor. The semiconductor layer having the additional contact thereto may form the base of the bipolar transistor.

In a further alternative of the embodiments, the deep trench may have a diffusion layer of a first conductivity type and the other trench may have two diffusions comprising a deep diffusion having the same conductivity type as the deep trench diffusion layer and the second shallow diffusion having an opposite conductivity type. For example, the deep trench and the deep diffusion may have an n type conductivity. The shallow diffusion may have a p type diffusion. In this way it is possible to form a Shockley diode between the deep and shallow trenches.

In a yet further alternative to the Shockley diode as described above, it is possible to form a silicon controlled rectifier by the addition of a further contact as described with respect to bipolar transistor arrangement described above. The arrangements of the present disclosure may find applications in discrete surge protection devices or the arrangements may be integrated on an integrated circuit to provide on chip surge protection.

In the context of the present disclosure, conductivity type of a semiconductor of a semiconductor crystal, wafer, layer or substrate identifies the majority charge carrier in the semiconductor. The two types of materials are n-type and p-type. The majority current carriers in n-type material are electrons. The majority current carriers in p-type material are holes.

Particular and preferred aspects of the present disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor device comprising:
   a semiconductor substrate and a semiconductor layer located on a first major surface of the semiconductor substrate; and
   at least one shallow trench comprising a base region and sidewall regions;
   at least one deep trench comprising a base region and sidewall regions, each of the at least one shallow trench and the at least one deep trench extending from a first major surface of the semiconductor layer, wherein the respective sidewall regions and base region of the respective at least one shallow trench and at least one deep trench each comprise a doped trench region and are at least partially filled with a conductive material contacting the doped trench region,
   wherein the at least one shallow trench terminates in the semiconductor layer and the at least one deep trench terminates in the semiconductor substrate;
   an isolating layer formed on the first major surface of the semiconductor layer directly above the at least one shallow trench and the at least one deep trench; and
   a first electrical contact formed on the isolating layer and electrically connected to the conductive material of either the at least one shallow trench or the at least one deep trench by a via through the isolating layer.

2. The semiconductor device of claim 1, further comprising an alternating structure of a plurality of the shallow trenches and a plurality of the deep trenches.

3. The semiconductor device of claim 1, further comprising a second electrical contact arranged on a second major surface of the semiconductor substrate opposing the first major surface of the semiconductor substrate.

4. The semiconductor device of claim 1, wherein the semiconductor substrate is a first conductivity type, the semiconductor layer is a second conductivity type, and the doped trench region is the first conductivity type.

5. The semiconductor device of claim 1, further comprising an additional isolating layer placed between the semiconductor substrate and the semiconductor layer.

6. A method of manufacturing a semiconductor device comprising:
   forming a semiconductor layer on a first major surface of a semiconductor substrate;
   forming an oxide on a first major surface of the semiconductor layer above regions where at least one shallow trench and at least one deep trench will be formed;

forming windows in the oxide above the regions where the at least one shallow trench and at least one deep trench will be formed;

forming a resist layer in the window where the at least one shallow trench will be formed;

etching the region where the at least one deep trench is to be formed to a first depth by removing the semiconductor layer where no resist or oxide is present while simultaneously removing the resist layer in the region where the at least one shallow trench will be formed;

forming the at least one deep trench and the at least one shallow trench by simultaneously etching the at least one deep trench and the at least one shallow trench to respective final depths so that each of the at least one shallow trench and at least one deep trench extends from the first major surface of the semiconductor layer, wherein the at least one shallow trench terminates in the semiconductor layer and the at least one deep trench terminates in the semiconductor substrate;

forming a doped trench region at sidewall regions and a base region of the each of the at least one shallow trench and at least one deep trench; and forming a conductive material to contact the doped trench region in each of the at least one shallow trench and at least one deep trench.

7. The method of claim 6, comprising forming an alternating structure of a plurality of the shallow trenches and a plurality of the deep trenches.

8. The method of claim 6, further comprising forming a first electrical contact for electrically connecting to the conductive material of the at least one shallow trench.

9. The method of claim 8, further comprising forming a second electrical contact on a second major surface of the semiconductor substrate opposing the first major surface of the semiconductor substrate.

10. The method of claim 6, wherein forming the respective doped trench regions at the sidewall regions and base region of the at least one shallow trench and the at least one deep trench comprises exposing the respective sidewalls and base region of the respective at least one shallow trench and the at least one deep trench to a doping diffusion.

11. The method of claim 10, further comprising electrically contacting the conductive material of the at least one shallow trench to a common contact formed on the first major surface of the semiconductor layer.

12. The method of claim 11, further comprising electrically isolating the common contact formed on the first major surface of the semiconductor layer from the conductive material of the at least one deep trench.

* * * * *